(12) United States Patent
Zhang

(10) Patent No.: US 11,088,234 B2
(45) Date of Patent: Aug. 10, 2021

(54) ARRAY SUBSTRATE AND MANUFACTURING METHOD THEREOF, AND DISPLAY PANEL

(71) Applicant: Wuhan China Star Optoelectronics Semiconductor Display Technology Co., Ltd., Wuhan (CN)

(72) Inventor: Weibin Zhang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 76 days.

(21) Appl. No.: 16/611,489

(22) PCT Filed: Jul. 17, 2019

(86) PCT No.: PCT/CN2019/096326
§ 371 (c)(1),
(2) Date: Nov. 7, 2019

(87) PCT Pub. No.: WO2020/220476
PCT Pub. Date: Nov. 5, 2020

(65) Prior Publication Data
US 2020/0343324 A1    Oct. 29, 2020

(30) Foreign Application Priority Data

Apr. 29, 2019   (CN) .......................... 201910352708.6

(51) Int. Cl.
*H01L 27/32*    (2006.01)
*H01L 51/00*    (2006.01)
*H01L 51/56*    (2006.01)

(52) U.S. Cl.
CPC ...... *H01L 27/3258* (2013.01); *H01L 51/0097* (2013.01); *H01L 51/56* (2013.01); *H01L 2227/323* (2013.01); *H01L 2251/5338* (2013.01)

(58) Field of Classification Search
CPC . H01L 51/0097; H01L 27/3258; H01L 51/56; H01L 2251/5338; H01L 2227/323
See application file for complete search history.

(56) References Cited

U.S. PATENT DOCUMENTS

2011/0203723 A1*   8/2011   Lee .................. B41F 13/10
                                                156/217
2017/0271312 A1    9/2017   Kwon
(Continued)

FOREIGN PATENT DOCUMENTS

| CN | 105679774 | 6/2016 |
| CN | 106356380 | 1/2017 |

(Continued)

*Primary Examiner* — Thanh Y. Tran

(57) ABSTRACT

An array substrate, a manufacturing method thereof and a display panel are provided. The display panel includes a flexible substrate having a flat portion, a first island portion and a second island portion. The first island portion and the second island portion extend and are protruded from the flat portion and are space apart from each other. A semiconductor device is disposed on the flat portion of the flexible substrate. An organic electroluminescent device is disposed on the semiconductor device. The present application solves the problem of film layers easily to be peeled off and traces easily to be broken for bent flexible display panels in existing arts.

13 Claims, 2 Drawing Sheets

(56) References Cited

U.S. PATENT DOCUMENTS

2020/0105168 A1\* 4/2020 Choi ................. G09F 9/301
2020/0111959 A1  4/2020 Deng
2020/0341516 A1\* 10/2020 Huang ................ G09F 9/301

FOREIGN PATENT DOCUMENTS

| CN | 108231800 | 6/2018 |
| CN | 108288637 | 7/2018 |
| CN | 207409491 | 8/2018 |

\* cited by examiner

ARRAY SUBSTRATE AND MANUFACTURING METHOD THEREOF, AND DISPLAY PANEL

RELATED APPLICATIONS

This application is a National Phase of PCT Patent Application No. PCT/CN2019/096326 having International filing date of Jul. 17, 2019, which claims the benefit of priority of Chinese Patent Application No. 201910352708.6 filed on Apr. 29, 2019. The contents of the above applications are all incorporated by reference as if fully set forth herein in their entirety.

FIELD AND BACKGROUND OF THE INVENTION

The present application relates to display technologies, and more particularly to an array substrate and a manufacturing method thereof, and a display panel.

In organic light emitting diode (OLED) display panels, each pixel structure includes an organic electroluminescent (EL) device, which includes an anode, a cathode and a light emitting layer disposed between the two. The light emitting layer is driven by an electric field between the anode and the cathode and emits light rays by injection and recombination of charge carriers.

FIG. 1 is a schematic diagram showing an existing flexible OLED display panel. As shown in FIG. 1, the existing flexible OLED display panel includes a flexible substrate (e.g., a polyimide substrate) 11, a dielectric layer 12, a buffer layer 13, a semiconductor layer 14, a gate insulating layer 15, a gate electrode layer 16, an inorganic first insulating interlayer 17, an organic second insulating interlayer 18, a source drain metal layer 19, a flattening layer 20, an anode metal layer 21, a pixel definition layer 22 and a photo spacer 23. The existing flexible OLED display panel further includes a first inversed island portion 24 formed by extending the second insulating interlayer 18 to a first slot and a second inversed island portion 25 formed by extending the second insulating interlayer 18 to a second slot. The first inversed island portion 24 and the second inversed island portion 25 are made of organic material and serve as a bending region for providing the needed flexibility in bending the flexible OLED display panel.

In the existing arts, two etching processes are needed to form the first inversed island portion 24 and the second inversed island portion 25. The top half of the first inversed island portion 24 and the second inversed island portion are formed in a first etching process. The second inversed island portion 25 is further etched in a second etching process to form the bottom half of the second inversed island portion. The etching processes are complicated and tedious. Moreover, in the existing arts, the first inversed island portion 24 and the second inversed island portion 25 are formed by etching inorganic insulating layers. After the inorganic insulating layers are etched, moisture and oxygen are easily to permeate into the device via interfaces between film layers. The first inversed island portion 24 and the second inversed island portion 25 correspond to the bending region. After the first inversed island portion 24 and the second inversed island portion 25 are bent, it is easy to peel off the first inversed island portion 24 and the second inversed island portion 25, or the flexible substrate 11 from the cross section of film layers. Further, metal layers (e.g., the source drain traces) 26 located above the first inversed island portion 24 and the second inversed island portion 25 are easily to be cracked.

SUMMARY OF THE INVENTION

The objective of the present application is to provide an array substrate and a manufacturing method thereof, for solving the problem of film layers easily to be peeled off and traces easily to be broken for array substrates in existing arts.

To achieve above objective, in an aspect, the present application provides an array substrate including:

a flexible substrate, having a flat portion and an island portion extending and protruded from the flat portion.

In an embodiment of the present application, the island portion includes a first island portion and a second island portion, which are spaced apart from each other.

In an embodiment of the present application, the array substrate further includes an array structure layer including:

a semiconductor layer, disposed at a side of the flexible substrate having the flat portion and the island portion;

a second insulating layer, disposed on the semiconductor layer;

a gate electrode layer, disposed on the second insulating layer;

a third insulating layer, disposed on the gate electrode layer and the second insulating layer;

a source drain metal layer, disposed on the third insulating layer and filling a source via and a drain via that are formed in the second insulating layer and the third insulating layer, the source drain metal layer electrically connecting to the semiconductor layer through the source via and the drain via, wherein the island portion of the flexible substrate exposes from the third insulating layer.

In an embodiment of the present application, the array structure layer further includes:

a fourth insulating layer, disposed on the third insulating layer, the fourth insulating layer being an organic layer, wherein the island portion of the flexible substrate falls in the fourth insulating layer.

In another aspect, the present application provides a method for manufacturing an array substrate, which includes:

providing a carrier; and disposing a flexible substrate on the carrier, wherein the flexible substrate has a flat portion and an island portion which extends and is protruded from the flat portion.

In an embodiment of the present application, the island portion includes a first island portion and a second island portion, which are spaced apart from each other.

In an embodiment of the present application, the step of disposing the flexible substrate includes:

coating an organic material on the carrier;

performing an exposure on the organic material using a shadow mask of which transparent regions having different light transmittance; and performing a development on the organic material to form the flat portion and the island portion.

In an embodiment of the present application, the step of disposing the flexible substrate includes:

coating an organic material on the carrier; and patterning the coated organic material using laser to form the flat portion and the island portion.

In an embodiment of the present application, the method further includes a step of disposing an array structure layer on the flexible substrate and the step of disposing the array structure layer includes:

disposing a semiconductor layer at a side of the flexible substrate having the flat portion and the island portion;

disposing a semiconductor layer on the semiconductor layer;

disposing a gate electrode layer on the second insulating layer;

disposing a third insulating layer on the gate electrode layer and the second insulating layer; and etching the second insulating layer and the third insulating layer to form a source via and a drain via, filling the source via and the drain via with a source drain metal layer and forming a source electrode and a drain electrode of the source drain metal layer on the third insulating layer, wherein the island portion of the flexible substrate exposes from the third insulating layer.

In an embodiment of the present application, the step of disposing the array structure layer further includes:

disposing a fourth insulating layer on the third insulating layer, the fourth insulating layer being an organic layer, wherein the island portion of the flexible substrate falls in the fourth insulating layer.

In still another aspect, the present application provides a display panel including:

a flexible substrate, having a flat portion, a first island portion and a second island portion, the first island portion and the second island portion extending and protruded from the flat portion and spaced apart from each other;

a semiconductor device, disposed on the flat portion of the flexible substrate; and an organic electroluminescent device, disposed on the semiconductor device.

In an embodiment of the present application, the semiconductor device includes:

a semiconductor layer;

a second insulating layer, disposed on the semiconductor layer;

a gate electrode layer, disposed on the second insulating layer;

a third insulating layer, disposed on the gate electrode layer and the second insulating layer;

a source drain metal layer, disposed on the third insulating layer and filling a source via and a drain via that are formed in the second insulating layer and the third insulating layer, the source drain metal layer electrically connecting to the semiconductor layer through the source via and the drain via, wherein the top of the first island portion and the second island portion of the flexible substrate is located above the third insulating layer.

In an embodiment of the present application, the display panel further includes:

a first insulating layer, disposed on the flexible substrate, wherein the semiconductor device is disposed on the first insulating layer, and the first insulating layer is a buffer layer.

In an embodiment of the present application, the display panel further includes:

source drain traces, disposed on the top of the first island portion and the second island portion and contacting the top of the first island portion and the second island portion.

In an embodiment of the present application, the semiconductor device includes:

a fourth insulating layer, disposed on the third insulating layer, wherein the fourth insulating layer is an organic layer, the source drain metal layer is disposed on the fourth insulating layer and fills in the source via and the drain via formed in the second insulating layer, the third insulating layer and the fourth insulating layer via, and the source drain metal layer is electrically connect to the semiconductor layer through the source via and the drain via, wherein the top of the first island portion and the second island portion of the flexible substrate falls in the fourth insulating layer.

In an embodiment of the present application, the display panel further includes:

source drain traces, disposed on the fourth insulating layer at positions corresponding to the top of the first island portion and the second island portion.

In the present application, the first island portion and the second island portion of the flexible substrate are manufactured by exposure and development performed on organic material in a halftone process, or by a laser process. The organic island portions are disposed while the flexible substrate is manufactured. Accordingly, the number of processes is reduced. Further, the first island portion and the second island portion are not manufactured by etching inorganic insulating layers. Therefore, a better ability to block moisture and oxygen is yielded. Also, the first island portion, the second island portion and the base layer PI are integratedly formed, achieving a stable structure, thereby effectively avoiding peeling or cracking in bending the display panel.

DESCRIPTION OF SPECIFIC EMBODIMENTS OF THE INVENTION

To make the objectives, technical schemes, and effects of the present application more clear and specific, the present application is described in further detail below with reference to the embodiments in accompanying with the appending drawings. It should be understood that the specific embodiments described herein are merely for explaining the present application, the term "embodiment" used in the context means an example, instance or illustration, and the present application is not limited thereto.

Figure 1:
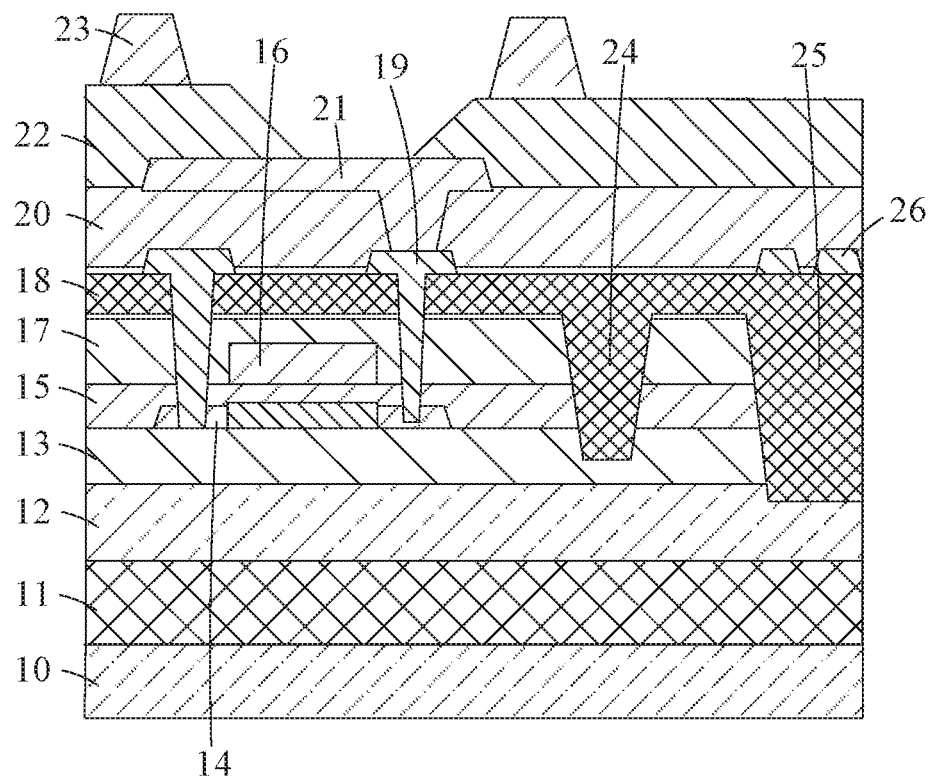
FIG. 1 is a schematic diagram showing an existing flexible OLED display panel.
Figure 2:
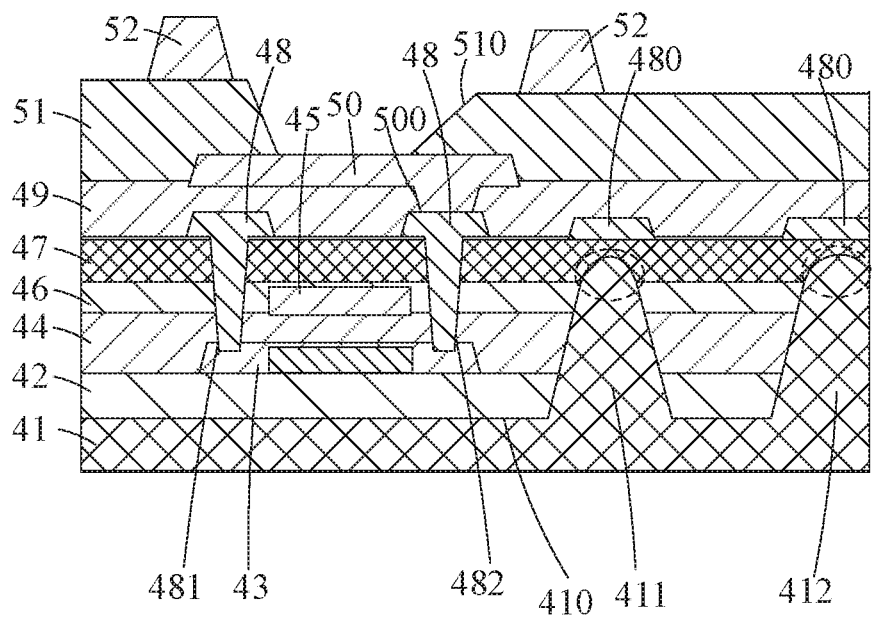
FIG. 2 is a schematic diagram illustrating a display panel according to a first embodiment of the present application.

FIG. 2 is a schematic diagram illustrating a display panel according to a first embodiment of the present application. The display panel of the present application can be implemented by a flexible organic light emitting diode (OLED) display panel, but is not limited thereto. The display panel includes a flexible substrate 41, a first insulating layer 42, a semiconductor layer 43, a second insulating layer 44, a gate electrode layer 45, a third insulating layer 46, a fourth insulating layer 47, a source drain metal layer 48, a fifth insulating layer 49, an anode metal layer 50, a sixth insulating layer 51 and a photo spacer 52. As shown in FIG. 2, the display panel includes an organic electroluminescent (EL) device, which includes an anode formed by the anode metal layer 50, and a light emitting layer (not shown) and a cathode (not shown) that are sequentially formed on the anode metal layer 50. The light emitting layer is driven by an electric field between the anode and the cathode and emits light rays by injection and recombination of charge carriers (i.e., electrons and holes).

The first embodiment of the present application provides a method for manufacturing a display panel, which can be implemented by a method for manufacturing a flexible OLED display panel, but is not limited thereto. The method includes the following steps:

In Step A, the flexible substrate 41 is disposed. The flexible substrate 41 has a flat portion, a first island portion 411 and a second island portion 412. The first island portion 411 and the second island portion 412 extend and are protruded from the flat portion 410 and are spaced apart from each other. The top of the first island portion 411 and the second island portion 412 of the flexible substrate 41 has a face with gradually-changed slopes, which has a smooth depression or protrusion, or their combination. The material of the flexible substrate 41 is polyimide (PI), for example. The polyimide is doped with a certain amount of light sensitive material. The thickness of the PI is about 20 micrometers. The flexible substrate 41 is flexible and is provided for the display panel to possess a bending ability. Specifically, the flat portion 410 corresponds to a non-bending region of the display panel and the first island portion 411 and the second island portion 412 correspond to a bending region of the display panel. The display panel can be bet with help of flexibility of the first island portion 411 and the second island portion 412. As an exemplary example, the first island portion 411 and the second island portion 412 can be disposed between every two thin-film transistors (TFTs) such that the display panel can be bent at any arbitrary position.

Figure 3:
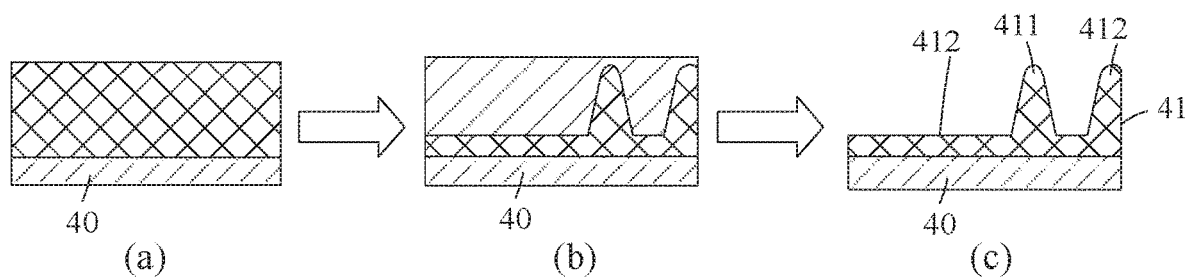
FIG. 3 is a schematic diagram illustrating a process in manufacturing a flexible substrate according to the present application.

In an embodiment, referring to FIG. 3, the flexible substrate 41 is manufactured by a halftone process. Specifically, Step A includes the following steps:

In Step A1, an organic material is coated on a carrier 40. As shown in part (a) of FIG. 3, the organic material (e.g., PI) is coated on the carrier 40, which can be a glass carrier.

In Step A2, an exposure is performed on the organic material using a shadow mask of which transparent regions having different light transmittance. For instance, the transmittance of the transparent region of the shadow mask corresponding to the island portion 411 or 412 is increasingly or decreasingly distributed. The transmittance corresponding to the top of the island portion 411 or 412 is lower than the transmittance corresponding to the slopes of the island portion 411 or 412. Accordingly, after development, an island pattern is formed as shown in part (b) of FIG. 3.

In Step A3, a development is performed on the organic material to form the flat portion 410, the first island portion 411 and the second island portion 412. The flexible substrate 41 is formed after the development. As shown in part (c) of FIG. 3, the flexible substrate 41 includes the flat portion 410, and the first island portion 411 and the second island portion 412 that extend and are protruded from the flat portion 410 and are spaced apart from each other.

In another embodiment, the flexible substrate 41 is manufactured by a laser process. An organic material is coated on the carrier 40, which can be a glass carrier. After that, the coated organic material is patterned by use of laser such that the flexible substrate 41 is formed with the flat portion 410, the first island portion 411 and the second island portion 412. A complicated and accurate shape can be formed using the laser process.

In Step B, the first insulating layer 42 is disposed on the flexible substrate 41. The first insulating layer 42 is a buffer layer, which can be a silicon nitride layer or a silicon dioxide layer, and is formed using chemical vapor deposition. The thickness of the first insulating layer 42 is about 1.5 micrometers.

In Step C, the semiconductor layer 43 is formed on the first insulating layer 42. The semiconductor layer 43 is disposed at a position corresponding to the flat portion 410 of the flexible substrate 41. The semiconductor layer 43 is formed with a pattern using exposing, developing and etching techniques. The material of the semiconductor layer 43 can be low temperature poly-silicon (LTPS). The semiconductor layer 43 an undoped region located at a central portion and doped regions located at two sides of the undoped region.

In Step D, the second insulating layer 44 is disposed on the semiconductor layer 43 and the first insulating layer 42. The second insulating layer 44 is a separating layer, which can be a silicon nitride layer or a silicon dioxide layer, and is deposited on the semiconductor layer 43 and the first insulating layer 42 using chemical vapor deposition.

In Step E, the gate electrode layer 45 is disposed on the second insulating layer 44. The gate electrode layer 45 is disposed at a position corresponding to the semiconductor layer 43 and at a position corresponding to the flat portion 410 of the flexible substrate 41. The gate electrode layer 45 is formed with a pattern using exposing, developing and etching techniques. The material of the gate electrode layer 45 can be molybdenum (Mo).

In Step F, the third insulating layer 46 is disposed on the gate electrode layer 45 and the second insulating layer 44. The third insulating layer 46 is a first dielectric interlayer, which can be a silicon nitride layer or a silicon dioxide layer, and is deposited on the gate electrode layer 45 and the second insulating interlayer 44 using chemical vapor deposition.

In Step G, the second insulating layer 44 and the third insulating layer 46 are etched to form a source via 481 and a drain via 482, which are filled with a part of the source drain metal layer 48. In this step, the second insulating layer 44 and the third insulating layer 46 are patterned form the source via 481 and the drain via 482. A part of source drain metal material fills in the source via 481 and the drain via 482.

In Step H, the fourth insulating layer 47 is disposed on the third insulating layer 46 and a part of the source drain metal layer 48. The fourth insulating interlayer 47 is a second dielectric interlayer, which is an organic material such as polyimide, and is used to increase stability in bending the display panel and provide a certain degree of ability to block moisture and oxygen, avoiding the lower semiconductor device suffering from invasion of the moisture and oxygen.

In Step I, the fourth insulating layer 47 is etched to form the source via 481 and the drain via 482. The source via 481 and the drain via 482 are filled with a part of the source drain metal layer 48. A source electrode and a drain electrode of the source drain metal layer 48 is formed on the fourth insulating layer 47. In this step, the fourth insulating layer 47 is patterned form the source via 481 and the drain via 482. A part of the source drain metal material fills in the source via 481 and the drain via 482.

That is, since the second insulating layer 44 and the third insulating layer 46 are inorganic layers and the fourth insulating layer 47 is an organic layer, the source drain metal layer 48 is filled in the source via 481 and the drain via 482 in two steps, i.e., Steps G and I.

The source electrode of the source drain metal layer 48 is electrically connected to the semiconductor layer 43 through the source via 481. The drain electrode of the source drain metal layer 48 is electrically connected to the semiconductor layer 43 through the drain via 482. The material of the source drain metal layer 48 can be Ti/Al/Ti and is patterned using exposing, developing and etching techniques to obtain the pattern of source electrode and drain electrode.

Step I may further include a step of:

disposing source drain trances 480 on the fourth insulating layer 47. The source drain traces 480 are manufactured using a shadow mask as the same as that used in manufacturing the source electrode and the drain electrode of the source drain metal layer 48. The source drain traces 480 may adopt a same metal material as the source electrode and the drain electrode, and is formed by pattering by use of exposing, developing and etching techniques. The source drain traces 480 are used to connect to a driving IC located outside the display panel.

In Step J, the fifth insulating layer 49 is disposed on the source electrode and the drain electrode of the source drain metal layer 48 and the fourth insulating layer 47. The fifth insulating layer 49 is a flattening layer, which can be a silicon nitride layer or a silicon dioxide layer, and is formed using chemical vapor deposition.

Step J may further include a step of:

disposing the fifth insulating layer 49 on the source electrode and the drain electrode of the source drain metal layer 48, the fourth insulating layer 47 and the source drain traces 480. In case that the source drain traces 480 are disposed, the fifth insulating layer 49 is disposed on the source electrode and the drain electrode of the source drain metal layer 48, the fourth insulating layer 47 and the source drain traces 480.

In Step K, the fifth insulating layer 49 is etched at a position corresponding to the drain electrode of the source drain metal layer 48 to form an anode via 500, and the anode metal layer 50 is disposed on the fifth insulating layer 49 such that the anode metal layer 50 is electrically connected to the drain electrode of the source drain metal layer 48 through the anode via 500. The anode metal layer 50 is made of transparent conductive metal such as indium tin oxide (ITO). The fifth insulating layer 49 is provided with the anode via 500, through which the anode metal layer 50 is electrically connected to the drain electrode of the source drain metal layer 48. The anode of the EL device is formed by the anode metal layer 50.

In Step L, the sixth insulating layer 51 and the photo spacer 52 are disposed on the anode metal layer 50 and the fifth insulating layer 49. The sixth insulating layer 51 is a pixel definition layer. The sixth insulating layer 51 and the photo spacer 52 can be formed at a same time with one exposure in a halftone process. The sixth insulating layer 51 is perforated to form a device via 510. The light emitting layer and the cathode of the EL device are sequentially disposed on the anode metal layer 50 through the device via. The light emitting layer of the EL device is electrically connected to the anode metal layer 50 through the device via 510. The photo spacer 52 is disposed at two sides of the EL device.

In above embodiment, the flexible substrate 41 and the fourth insulating layer 47 are organic layers, and the first insulating layer 42, the second insulating layer 44, the third insulating layer 46 and the fifth insulating layer 49 are inorganic layers. The organic insulating layer 41 is manufactured using the halftone process or the laser process. The fourth insulating layer 47 is manufactured using a coating process. The first insulating layer 42, the second insulating layer 44, the third insulating layer 46 and the fifth insulating layer 49 are formed using chemical vapor deposition.

In an embodiment, the top of the first island portion 411 and the second island portion 412 of the flexible substrate 41 falls in the fourth insulating layer 47. Specifically, the fourth insulating layer 47 has a top surface and a bottom surface, and the top of the first island portion 411 and the second island portion 412 is located between the top surface and the bottom surface of the fourth insulating layer 47. Further, the top of the first island portion 411 and the second island portion 412 falls between the top surface and the bottom surface of the fourth insulating layer 47 in the non-bending region.

Since the fourth insulating layer 47 is an organic layer and is manufactured using the coating process, the fourth insulating layer 47 will cover the top of the first island portion 411 and the second island portion 412 and make the whole film layers flattened when the first island portion 411 and the second island portion 412 falls in the fourth insulating layer 47. That is, the top surface of the fourth insulating layer 47 is a flat surface.

In addition, since the first insulating layer 42, the second insulating layer 44 and the third insulating layer 46 are formed using chemical vapor deposition, a part of material of the first insulating layer 42, the second insulating layer 44 and the third insulating layer 46 may be deposited on the top (as indicated by an area circled by dash line in FIG. 2) of the first island portion 411 and the second island portion 412. That is, the first insulating layer 42, the second insulating layer 44 and the third insulating layer 46 will be sequentially deposited on the top of the first island portion 411 and the second island portion 412, which is thus shaped as a portion. However, the corresponding place will be flattened after coating the fourth insulating layer 47.

In an embodiment, after the third insulating layer 46 is disposed, the first insulating layer 42, the second insulating layer 44 and the third insulating layer 46 deposited on the top of the first island portion 411 and the second island portion 412 are removed by etching. Then, flattening is performed by coating the fourth insulating layer 47. This achieves a more stable structure and film layers are not easily to fall off or peel off.

On the basis of the first embodiment, referring to FIG. 2, the present application further provides a display panel including a flexible substrate 41 having a flat portion 410, a first island portion 411 and a second island portion 412. The first island portion 411 and the second island portion 412 extend and are protruded from the flat portion 410 and are space apart from each other. A semiconductor device is disposed on the flat portion 410 of the flexible substrate 41. An organic electroluminescent device is disposed on the semiconductor device.

In an embodiment, the semiconductor device includes a first insulating layer 42, a semiconductor layer 43, a second insulating layer 44, a gate electrode layer 45, a third insulating layer 46, a fourth insulating layer 47, a source drain metal layer 48 and a fifth insulating layer 49. In an embodiment, the organic electroluminescent device includes an anode, a cathode and a light emitting layer disposed between the anode and the cathode.

Other details of the display panel of the present application are referred to corresponding descriptions on the manufacturing method in above context, and are not repeated herein.

Compared to the existing arts, the display panel and the manufacturing method thereof according to the first embodiment of the present application have the following advantages:

(1) In the existing arts, two etching processes are needed to form the first island portion and the second island portion. The top half of the first island portion and the second island portion are formed in a first etching process. The second island portion is further etched in a second etching process to form the bottom half of the second island portion. The etching processes are complicated and tedious. The first island portion and the second island portion of the present application are manufactured by exposure and development performed on organic material in the halftone process, or by the laser process. The organic island portions are disposed while the flexible substrate is manufactured. Accordingly, the number of processes is reduced.

(2) In the existing arts, the first island portion and the second island portion are formed by etching inorganic insulating layers. After the inorganic insulating layers are etched, moisture and oxygen are easily to permeate into the device via interfaces between film layers. The first island portion and the second island portion correspond to the bending region. After the first island portion and the second island portion are bent, it is easy to peel off the first island portion and the second island portion, or the substrate from the cross section (etched facets) of film layers. Further, metal layers (e.g., the source drain traces) located above the first island portion and the second island portion are easily to be cracked. In the present application, the first island portion and the second island portion are not manufactured by etching the inorganic insulating layers. Therefore, a better ability to block moisture and oxygen is yielded. Also, the first island portion, the second island portion and the base layer PI are integratedly formed, achieving a stable structure, thereby effectively avoiding peeling or cracking in bending the display panel.

Figure 4:
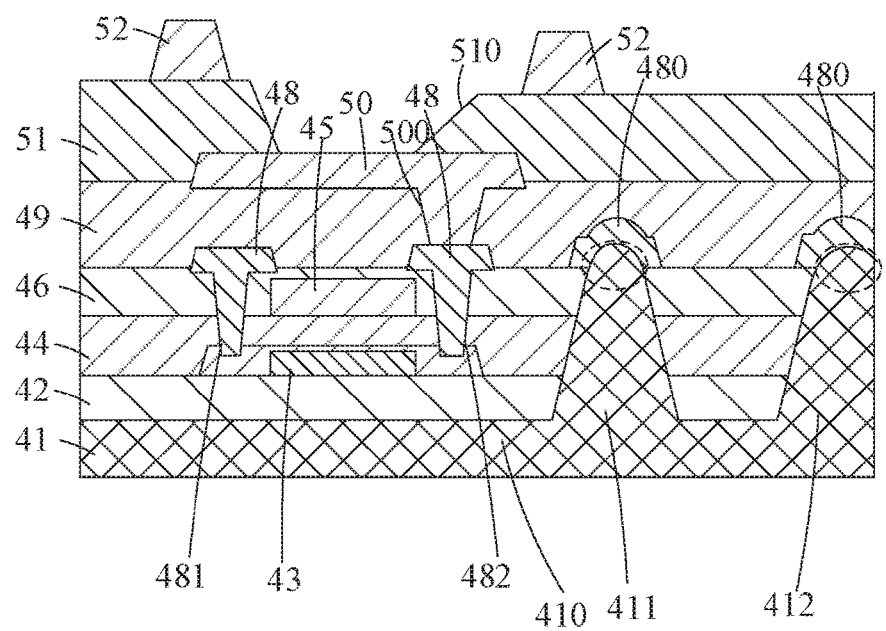
FIG. 4 is a schematic diagram illustrating a display panel according to a second embodiment of the present application.

FIG. 4 is a schematic diagram illustrating a display panel according to a second embodiment of the present application. The display panel of the present application can be implemented by a flexible organic light emitting diode (OLED) display panel, but is not limited thereto. The display panel includes a flexible substrate 41, a first insulating layer 42, a semiconductor layer 43, a second insulating layer 44, a gate electrode layer 45, a third insulating layer 46, a source drain metal layer 48, a fourth insulating layer 49, an anode metal layer 50, a fifth insulating layer 51 and a photo spacer 52. As shown in FIG. 2, the display panel includes an organic electroluminescent (EL) device, which includes an anode formed by the anode metal layer 50, and a light emitting layer (not shown) and a cathode (not shown) that are sequentially formed on the anode metal layer 50. The light emitting layer is driven by an electric field between the anode and the cathode and emits light rays by injection and recombination of charge carriers (i.e., electrons and holes).

The second embodiment of the present application provides a method for manufacturing a display panel, which can be implemented by a method for manufacturing a flexible OLED display panel, but is not limited thereto. The method includes the following steps:

In Step A, the flexible substrate 41 is disposed. The flexible substrate 41 has a flat portion, a first island portion 411 and a second island portion 412. The first island portion 411 and the second island portion 412 extend and are protruded from the flat portion 410 and are spaced apart from each other. The top of the first island portion 411 and the second island portion 412 of the flexible substrate 41 has a face with gradually-changed slopes, which has a smooth depression or protrusion, or their combination. The material of the flexible substrate 41 is polyimide (PI), for example. The polyimide is doped with a certain amount of light sensitive material. The thickness of the PI is about 20 micrometers. The flexible substrate 41 is flexible and is provided for the display panel to possess a bending ability. Specifically, the flat portion 410 corresponds to a non-bending region of the display panel and the first island portion 411 and the second island portion 412 correspond to a bending region of the display panel. The display panel can be bet with help of flexibility of the first island portion 411 and the second island portion 412. As an exemplary example, the first island portion 411 and the second island portion 412 can be disposed between every two thin-film transistors (TFTs) such that the display panel can be bent at any arbitrary position.

In an embodiment, referring to FIG. 3, the flexible substrate 41 is manufactured by a halftone process. Specifically, Step A includes the following steps:

In Step A1, an organic material is coated on a carrier 40. As shown in part (a) of FIG. 3, the organic material (e.g., PI) is coated on the carrier 40, which can be a glass carrier.

In Step A2, an exposure is performed on the organic material using a shadow mask of which transparent regions having different light transmittance. For instance, the transmittance of the transparent region of the shadow mask corresponding to the island portion 411 or 412 is increasingly or decreasingly distributed. The transmittance corresponding to the top of the island portion 411 or 412 is lower than the transmittance corresponding to the slopes of the island portion 411 or 412. Accordingly, after development, an island pattern is formed as shown in part (b) of FIG. 3.

In Step A3, a development is performed on the organic material to form the flat portion 410, the first island portion 411 and the second island portion 412. The flexible substrate 41 is formed after the development. As shown in part (c) of FIG. 3, the flexible substrate 41 includes the flat portion 410, and the first island portion 411 and the second island portion 412 that extend and are protruded from the flat portion 410 and are spaced apart from each other.

In another embodiment, the flexible substrate 41 is manufactured by a laser process. An organic material is coated on the carrier 40, which can be a glass carrier. After that, the coated organic material is patterned by use of laser such that the flexible substrate 41 is formed with the flat portion 410, the first island portion 411 and the second island portion 412. A complicated and accurate shape can be formed using the laser process.

In Step B, the first insulating layer 42 is disposed on the flexible substrate 41. The first insulating layer 42 is a buffer layer, which can be a silicon nitride layer or a silicon dioxide layer, and is formed using chemical vapor deposition. The thickness of the first insulating layer 42 is about 1.5 micrometers.

In Step C, the semiconductor layer 43 is formed on the first insulating layer 42. The semiconductor layer 43 is disposed at a position corresponding to the flat portion 410 of the flexible substrate 41. The semiconductor layer 43 is formed with a pattern using exposing, developing and etching techniques. The material of the semiconductor layer 43 can be low temperature poly-silicon (LTPS). The semiconductor layer 43 an undoped region located at a central portion and doped regions located at two sides of the undoped region.

In Step D, the second insulating layer 44 is disposed on the semiconductor layer 43 and the first insulating layer 42. The second insulating layer 44 is a separating layer, which can be a silicon nitride layer or a silicon dioxide layer, and is deposited on the semiconductor layer 43 and the first insulating layer 42 using chemical vapor deposition.

In Step E, the gate electrode layer 45 is disposed on the second insulating layer 44. The gate electrode layer 45 is disposed at a position corresponding to the semiconductor layer 43 and at a position corresponding to the flat portion 410 of the flexible substrate 41. The gate electrode layer 45 is formed with a pattern using exposing, developing and etching techniques. The material of the gate electrode layer 45 can be molybdenum (Mo).

In Step F, the third insulating layer 46 is disposed on the gate electrode layer 45 and the second insulating layer 44. The third insulating layer 46 is a first dielectric interlayer, which can be a silicon nitride layer or a silicon dioxide layer, and is deposited on the gate electrode layer 45 and the second insulating interlayer 44 using chemical vapor deposition.

In Step G, the second insulating layer 44 and the third insulating layer 46 are etched to form the source via 481 and the drain via 482. The source via 481 and the drain via 482 are filled with the source drain metal layer 48. A source electrode and a drain electrode of the source drain metal layer 48 is formed on the third insulating layer 46. In this step, the second insulating layer 44 and the third insulating layer 46 are patterned form the source via 481 and the drain via 482. A source drain metal material fills in the source via 481 and the drain via 482. The source drain metal layer 48 located on the third insulating layer 46 are patterned using exposing, developing and etching techniques to obtain the pattern of the source electrode and the drain electrode.

The source electrode of the source drain metal layer 48 is electrically connected to the semiconductor layer 43 through the source via 481. The drain electrode of the source drain metal layer 48 is electrically connected to the semiconductor layer 43 through the drain via 482. The material of the source drain metal layer 48 can be Ti/Al/Ti.

Step G may further include a step of:

disposing source drain trances 480 on the third insulating layer 46. The source drain traces 480 are manufactured using a shadow mask as the same as that used in manufacturing the source electrode and the drain electrode of the source drain metal layer 48. The source drain traces 480 may adopt a same metal material as the source electrode and the drain electrode, and is formed by pattering by use of exposing, developing and etching techniques. The source drain traces 480 are used to connect to a driving IC located outside the display panel.

In Step H, the fourth insulating layer 49 is disposed on the source electrode and the drain electrode of the source drain metal layer 48 and the third insulating layer 46. The fourth insulating layer 49 is a flattening layer, which can be a silicon nitride layer or a silicon dioxide layer, and is formed using chemical vapor deposition.

Step H may further include a step of:

disposing the fourth insulating layer 49 on the source electrode and the drain electrode of the source drain metal layer 48, the third insulating layer 46 and the source drain traces 480. In case that the source drain traces 480 are disposed, the fourth insulating layer 49 is disposed on the source electrode and the drain electrode of the source drain metal layer 48, the third insulating layer 46 and the source drain traces 480.

In Step I, the fourth insulating layer 49 is etched at a position corresponding to the drain electrode of the source drain metal layer 48 to form an anode via 500, and the anode metal layer 50 is disposed on the fourth insulating layer 49 such that the anode metal layer 50 is electrically connected to the drain electrode of the source drain metal layer 48 through the anode via 500. The anode metal layer 50 is made of transparent conductive metal such as indium tin oxide (ITO). The fourth insulating layer 49 is provided with the anode via 500, through which the anode metal layer 50 is electrically connected to the drain electrode of the source drain metal layer 48. The anode of the EL device is formed by the anode metal layer 50.

In Step J, the fifth insulating layer 51 and the photo spacer 52 are disposed on the anode metal layer 50 and the fourth insulating layer 49. The fifth insulating layer 51 is a pixel definition layer. The fifth insulating layer 51 and the photo spacer 52 can be formed at a same time with one exposure in a halftone process. The fifth insulating layer 51 is perforated to form a device via 510. The light emitting layer and the cathode of the EL device are sequentially disposed on the anode metal layer 50 through the device via. The light emitting layer of the EL device is electrically connected to the anode metal layer 50 through the device via 510. The photo spacer 52 is disposed at two sides of the EL device.

In above embodiment, the flexible substrate 41 is an organic layer, and the first insulating layer 42, the second insulating layer 44, the third insulating layer 46 and the fourth insulating layer 49 are inorganic layers. The organic insulating layer 41 is manufactured using the halftone process or the laser process. The first insulating layer 42, the second insulating layer 44, the third insulating layer 46 and the fourth insulating layer 49 are formed using chemical vapor deposition.

In an embodiment, the top of the first island portion 411 and the second island portion 412 of the flexible substrate 41 is located above the third insulating layer 46 and falls in the fourth insulating layer 49. Specifically, the fourth insulating layer 49 has a top surface and a bottom surface, and the top of the first island portion 411 and the second island portion 412 is located between the top surface and the bottom surface of the fourth insulating layer 49. Further, the top of the first island portion 411 and the second island portion 412 falls between the top surface and the bottom surface of the fourth insulating layer 49 in the non-bending region.

Since the first insulating layer 42, the second insulating layer 44 and the third insulating layer 46 are formed using chemical vapor deposition, a part of material of the first insulating layer 42, the second insulating layer 44 and the third insulating layer 46 may be deposited on the top (as indicated by an area circled by dash line in FIG. 2) of the first island portion 411 and the second island portion 412.

In an embodiment, after the third insulating layer 46 is disposed, the first insulating layer 42, the second insulating layer 44 and the third insulating layer 46 deposited on the top of the first island portion 411 and the second island portion 412 are removed by etching so as to expose the top of the first island portion 411 and the second island portion 412. Then, the source drain metal layer 48 is disposed on the third insulating layer 46 and meanwhile the source drain traces 480 are disposed on the top of the first island portion 411 and the second island portion 412. After that, the step of disposing the fourth insulating layer 49 is executed.

As shown in FIG. 4, the source drain traces 480 are disposed on the top of the first island portion 411 and the second island portion 412, contact the top of the first island portion 411 and the second island portion 412, and is covered by the fourth insulating layer 49. Since the first island portion 411 and the second island portion 412 are flexible, disposing the source drain traces 480 of a metal material on the flexible organic layer makes the source drain traces 480 not be easily to be cracked in bending the display panel.

On the basis of the second embodiment, referring to FIG. 4, the present application further provides a display panel including a flexible substrate 41 having a flat portion 410, a first island portion 411 and a second island portion 412. The first island portion 411 and the second island portion 412 extend and are protruded from the flat portion 410 and are space apart from each other. A semiconductor device is disposed on the flat portion 410 of the flexible substrate 41. An organic electroluminescent device is disposed on the semiconductor device.

In an embodiment, the semiconductor device includes a first insulating layer 42, a semiconductor layer 43, a second insulating layer 44, a gate electrode layer 45, a third insulating layer 46, a source drain metal layer 48 and a fourth insulating layer 49. In an embodiment, the organic electroluminescent device includes an anode, a cathode and a light emitting layer disposed between the anode and the cathode.

Other details of the display panel of the present application are referred to corresponding descriptions on the manufacturing method in above context, and are not repeated herein.

Compared to the existing arts, the display panel and the manufacturing method thereof according to the second embodiment of the present application have the following advantages:

(1) In the existing arts, two etching processes are needed to form the first island portion and the second island portion. The top half of the first island portion and the second island portion are formed in a first etching process. The second island portion is further etched in a second etching process to form the bottom half of the second island portion. The etching processes are complicated and tedious. The first island portion and the second island portion of the present application are manufactured by exposure and development performed on organic material in the halftone process, or by the laser process. The organic island portions are disposed while the flexible substrate is manufactured. Accordingly, the number of processes is reduced.

(2) In the existing arts, the first island portion and the second island portion are formed by etching inorganic insulating layers. After the inorganic insulating layers are etched, moisture and oxygen are easily to permeate into the device via interfaces between film layers. The first island portion and the second island portion correspond to the bending region. After the first island portion and the second island portion are bent, it is easy to peel off the first island portion and the second island portion, or the substrate from the cross section (etched facets) of film layers. Further, metal layers (e.g., the source drain traces) located above the first island portion and the second island portion are easily to be cracked. In the present application, the first island portion and the second island portion are not manufactured by etching the inorganic insulating layers. Therefore, a better ability to block moisture and oxygen is yielded. Also, the first island portion, the second island portion and the base layer PI are integratedly formed, achieving a stable structure, thereby effectively avoiding peeling or cracking in bending the display panel.

The present application further provides an electronic device including a display panel. The display panel includes a flexible substrate having a flat portion, a first island portion and a second island portion. The first island portion and the second island portion extend and are protruded from the flat portion and are space apart from each other. A semiconductor device is disposed on the flat portion of the flexible substrate. An organic electroluminescent device is disposed on the semiconductor device.

Other details of the electronic device of the present application are referred to descriptions in above context, and are not repeated herein.

The present application further provides a flexible substrate having a flat portion, a first island portion and a second island portion. The first island portion and the second island portion extend and are protruded from the flat portion and are spaced apart from each other.

Other details of the flexible substrate of the present application are referred to descriptions in above context, and are not repeated herein.

The present application further provides an array substrate including a flexible substrate having a flat portion and an island portion extending and protruded from the flat portion.

In an embodiment of the present application, the island portion includes a first island portion and a second island portion, which are spaced apart from each other.

In an embodiment of the present application, the array substrate further includes an array structure layer including a semiconductor layer, disposed at a side of the flexible substrate having the flat portion and the island portion; a second insulating layer, disposed on the semiconductor layer; a gate electrode layer, disposed on the second insulating layer; a third insulating layer, disposed on the gate electrode layer and the second insulating layer; a source drain metal layer, disposed on the third insulating layer and filling a source via and a drain via that are formed in the second insulating layer and the third insulating layer, the source drain metal layer electrically connecting to the semiconductor layer through the source via and the drain via, wherein the island portion of the flexible substrate exposes from the third insulating layer.

In an embodiment of the present application, the array structure layer further includes a fourth insulating layer disposed on the third insulating layer, the fourth insulating layer being an organic layer, wherein the island portion of the flexible substrate falls in the fourth insulating layer.

Other details of the array substrate of the present application are referred to descriptions in above context, and are not repeated herein.

The present application further provides a method for manufacturing an array substrate, including providing a carrier; and disposing a flexible substrate on the carrier, wherein the flexible substrate has a flat portion and an island portion which extends and is protruded from the flat portion.

In an embodiment of the present application, the island portion includes a first island portion and a second island portion, which are spaced apart from each other.

In an embodiment of the present application, the step of disposing the flexible substrate includes coating an organic material on the carrier; performing an exposure on the organic material using a shadow mask of which transparent regions having different light transmittance; and performing a development on the organic material to form the flat portion and the island portion.

In an embodiment of the present application, the step of disposing the flexible substrate includes coating an organic material on the carrier; and pattering the coated organic material using laser to form the flat portion and the island portion.

In an embodiment of the present application, the method further includes a step of disposing an array structure layer on the flexible substrate, which includes disposing a semiconductor layer at a side of the flexible substrate having the flat portion and the island portion; disposing a semiconductor layer on the semiconductor layer; disposing a gate electrode layer on the second insulating layer; disposing a third insulating layer on the gate electrode layer and the second insulating layer; and etching the second insulating layer and the third insulating layer to form a source via and a drain via, filling the source via and the drain via with a source drain metal layer and forming a source electrode and a drain electrode of the source drain metal layer on the third insulating layer, wherein the island portion of the flexible substrate exposes from the third insulating layer.

In an embodiment of the present application, the step of disposing the array structure layer further includes disposing a fourth insulating layer on the third insulating layer, the fourth insulating layer being an organic layer, wherein the island portion of the flexible substrate falls in the fourth insulating layer.

Other details of the array substrate manufacturing method of the present application are referred to descriptions in above context, and are not repeated herein.

While the preferred embodiments of the present application have been illustrated and described in detail, various modifications and alterations can be made by persons skilled in this art. The embodiment of the present application is therefore described in an illustrative but not restrictive sense. It is intended that the present application should not be limited to the particular forms as illustrated, and that all modifications and alterations which maintain the realm of the present application are within the scope as defined in the appended claims.

What is claimed is:

1. An array substrate, comprising:
   a flexible substrate, having a flat portion and an island portion extending and protruded from the flat portion; and
   an array structure layer comprising:
   a semiconductor layer, disposed at a side of the flexible substrate having the flat portion and the island portion;
   a second insulating layer, disposed on the semiconductor layer;
   a gate electrode layer, disposed on the second insulating layer;
   a third insulating layer, disposed on the gate electrode layer and the second insulating layer;
   a source drain metal layer, disposed on the third insulating layer and filling a source via and a drain via that are formed in the second insulating layer and the third insulating layer, the source drain metal layer electrically connecting to the semiconductor layer through the source via and the drain via,
   wherein the island portion of the flexible substrate exposes from the third insulating layer.

2. The array substrate according to claim 1, wherein the island portion comprises a first island portion and a second island portion, which are spaced apart from each other.

3. The array substrate according to claim 1, wherein the array structure layer further comprises:
   a fourth insulating layer, disposed on the third insulating layer, the fourth insulating layer being an organic layer, wherein the island portion of the flexible substrate falls in the fourth insulating layer.

4. A method for manufacturing an array substrate, comprising:
   providing a carrier;
   disposing a flexible substrate on the carrier, wherein the flexible substrate has a flat portion and an island portion which extends and is protruded from the flat portion; and
   disposing an array structure layer on the flexible substrate, wherein the step of disposing the array structure layer comprises:
   disposing a semiconductor layer at a side of the flexible substrate having the flat portion and the island portion;
   disposing a semiconductor layer on the semiconductor layer;
   disposing a gate electrode layer on the second insulating layer;
   disposing a third insulating layer on the gate electrode layer and the second insulating layer; and
   etching the second insulating layer and the third insulating layer to form a source via and a drain via, filling the source via and the drain via with a source drain metal layer and forming a source electrode and a drain electrode of the source drain metal layer on the third insulating layer,
   wherein the island portion of the flexible substrate exposes from the third insulating layer.

5. The method according to claim 4, wherein the island portion comprises a first island portion and a second island portion, which are spaced apart from each other.

6. The method according to claim 4, wherein the step of disposing the flexible substrate comprises:
   coating an organic material on the carrier;
   performing an exposure on the organic material using a shadow mask of which transparent regions having different light transmittance; and
   performing a development on the organic material to form the flat portion and the island portion.

7. The method according to claim 4, wherein the step of disposing the flexible substrate comprises:
   coating an organic material on the carrier; and
   patterning the coated organic material using laser to form the flat portion and the island portion.

8. The method according to claim 4, wherein the step of disposing the array structure layer further comprises:
   disposing a fourth insulating layer on the third insulating layer, the fourth insulating layer being an organic layer, wherein the island portion of the flexible substrate falls in the fourth insulating layer.

9. A display panel, comprising:
   a flexible substrate, having a flat portion, a first island portion and a second island portion, the first island portion and the second island portion extending and protruded from the flat portion and spaced apart from each other;
   a semiconductor device, disposed on the flat portion of the flexible substrate; and
   an organic electroluminescent device, disposed on the semiconductor device,
   wherein the semiconductor device comprises:
   a semiconductor layer;
   a second insulating layer, disposed on the semiconductor layer;

a gate electrode layer, disposed on the second insulating layer;

a third insulating layer, disposed on the gate electrode layer and the second insulating layer;

a source drain metal layer, disposed on the third insulating layer and filling a source via and a drain via that are formed in the second insulating layer and the third insulating layer, the source drain metal layer electrically connecting to the semiconductor layer through the source via and the drain via, wherein the top of the first island portion and the second island portion of the flexible substrate is located above the third insulating layer.

10. The display panel according to claim 9, further comprising:

a first insulating layer, disposed on the flexible substrate, wherein the semiconductor device is disposed on the first insulating layer, and the first insulating layer is a buffer layer.

11. The display panel according to claim 9, further comprising:

source drain traces, disposed on the top of the first island portion and the second island portion and contacting the top of the first island portion and the second island portion.

12. The display panel according to claim 9, wherein the semiconductor device further comprises:

a fourth insulating layer, disposed on the third insulating layer, wherein the fourth insulating layer is an organic layer, the source drain metal layer is disposed on the fourth insulating layer and fills in the source via and the drain via formed in the second insulating layer, the third insulating layer and the fourth insulating layer via, and the source drain metal layer is electrically connect to the semiconductor layer through the source via and the drain via, wherein the top of the first island portion and the second island portion of the flexible substrate falls in the fourth insulating layer.

13. The display panel according to claim 12, further comprising:

source drain traces, disposed on the fourth insulating layer at positions corresponding to the top of the first island portion and the second island portion.

* * * * *